United States Patent
Bielefeldt et al.

(10) Patent No.: US 6,699,820 B2
(45) Date of Patent: Mar. 2, 2004

(54) METHOD FOR MAKING A SUPERCONDUCTOR WITH ENHANCED CURRENT CARRYING CAPABILITY

(76) Inventors: Hartmut Ulrich Bielefeldt, Marconi-Str. 10, D-86179 Augsburg (DE); Barbel Martha Gotz, Agnes-Bernauer-Str. 52, D-86159 Augsburg (DE); German Hammerl, Ludwig-Thoma-Str. 5, D-86672 Thierhaupten (DE); Johannes Wilhelmus Maria Hilgenkamp, Boterbloem 7, NL-7623 CD Borne (NL); Jochen Dieter Mannhart, Edelweissring 46, D-86343 Konigsbrunn (DE); Andreas Fritz Albert Schmehl, Webersteig 20, D-86738 Deiningen (DE); Christof Walter Schneider, Tannenstrasse 3, D-86343 Konigsbrunn (DE); Robert Ralf Schulz, Messerschmitt-Strasse 33b, D-86159 Augsburg (DE)

( * ) Notice: Subject to any disclaimer, the term of this patent is extended or adjusted under 35 U.S.C. 154(b) by 28 days.

(21) Appl. No.: 09/798,189

(22) Filed: Mar. 2, 2001

(65) Prior Publication Data

US 2002/0165100 A1 Nov. 7, 2002

(51) Int. Cl.[7] .............................. H01L 39/24; C09D 5/23
(52) U.S. Cl. ..................... 505/430; 505/125; 505/126; 505/780; 505/781; 505/450; 505/452; 505/470
(58) Field of Search ............................... 505/125, 126, 505/801, 809, 810, 780, 781, 430, 450, 452, 470, 500, 742

(56) References Cited

U.S. PATENT DOCUMENTS 5,106,823 A * 4/1992 Creuzet et al.
5,591,696 A * 1/1997 McDevitt et al.
5,696,392 A * 12/1997 Char et al.
5,972,845 A * 10/1999 Tauber et al.
6,191,073 B1 * 2/2001 Hojczyk et al.
6,221,812 B1 * 4/2001 Zhou et al.
6,310,297 B1 * 10/2001 Masur et al.

FOREIGN PATENT DOCUMENTS

EP         1006594 A1 * 7/2000

OTHER PUBLICATIONS

Daniels et al. "Improved strong magnetic fields performance of low angle grain boundaries of calcium and oxygen overdoped YBa2Cu3Ox" Nov. 13, 2000, Applied Physics Letters, vol. 77 No. 20, pp. 3251–3253.*

Hilgenkamp et al. "Supoerconducting and normal–state properties of YBa3Cu3O7–x bicrystal grain boundary junstions in thin films" Jul. 13, 1998, Applied Physics Letters, vol. 73 No. 2, pp. 265–267.*

*Primary Examiner*—Tom Dunn
*Assistant Examiner*—Colleen P. Cooke
(74) *Attorney, Agent, or Firm*—Bachman & LaPointe, P.C.

(57) ABSTRACT

The present invention concerns the improvement of the supercurrent carrying capabilities, i.e. the increase of critical current densities, of bicrystalline or polycrystalline superconductor structures, especially of high-$T_c$ superconductors. By providing an appropriate predetermined dopant profile across the superconductor structure, in particular within or in the vicinity of the grain boundaries, the space-charge layers at the grain boundaries are reduced and thereby the current transport properties of the superconductor significantly improved. Simultaneously, the influence of magnetic fields on the critical current densities is significantly reduced, which in turn enhances the overall supercurrent carrying capabilities while keeping the supercurrent transport properties of the grains at good values.

22 Claims, 9 Drawing Sheets

OTHER PUBLICATIONS

Kucera et al. "Transport characterization of calcium–doped YBa2Cu3O7–x thin films" Apr. 1, 1995, Physical Review B, vol. 51 No. 13, pp. 8582–8590.*

Hammerl et al. "Enhanced supercurrent density in polycrystalline YBa2Cu3O7–x at 77K from clacium doping of grain boundaries" Sep. 14, 2000, Nature, vol. 407, pp. 162–164.*

Palles et al. "The effect of Ca substitution on the structure and the Raman active phonon in Y1–xCaxBa2Cu3O7–y" 1998, J. Phy. COndens. Matter, vol. 10, pp. 2515–2524.*

Sung et al. "Properties of Coped–YBCO Bicrystal Grain BOUndary Junctions for Josephson FIeld Effect Transistor" 1997, Physica C 282–287, pp. 2475–2476.*

Narwankar et al. "Enhanced critical current density in Ca–doped Y1Ba2Cu3O8" Feb. 11, 1991, Applied Physics Letters 58 (6), pp. 651–653.*

"Nature", vol. 407, pp 162–164 (Letters to Nature), Title: Enhanced Supercurrent Density in Polycrystalline $YBa_2Cu_3O_{7-\delta}$ AT 77 K From Calcium Doping of Grain Boundaries, by G. Hammerl et al., published Sep. 14, 2000.

* cited by examiner

YBa$_2$Cu$_3$O$_{7-\delta}$ →

Y$_{1-x}$Ca$_x$Ba$_2$Cu$_3$O$_{7-\delta}$ → b)

Y$_{1-x}$Ca$_x$Ba$_2$Cu$_3$O$_{7-\delta}$ →

YBa$_2$Cu$_3$O$_{7-\delta}$ → grain boundary

METHOD FOR MAKING A SUPERCONDUCTOR WITH ENHANCED CURRENT CARRYING CAPABILITY

TECHNICAL FIELD

The present invention relates to superconductors, particularly to the current carrying capabilities of superconductors. It is a proven fact that the critical currents of many superconductors, here polycrystalline superconductors, are limited by grain boundaries formed in them. The invention overcomes this limitation of present superconductors by using alterations for improving the current transport properties of the superconductors' grain boundaries. This is done in principle by doping these grain boundaries to dopant concentrations different from the concentrations of the grains, thus aiming at diminishing detrimental effects caused by space charge layers formed at the grain boundaries.

BACKGROUND OF THE INVENTION

Based on the new class of superconductors, henceforth referred to as high-$T_c$ superconductors, which were discovered by Bednorz and Müller and disclosed in their article "Possible High-$T_c$ Superconductivity in the Ba—La—Cu—O System", Zeitschrift für Physik B, Condensed Matter, Vol. B64, 1986, pp.189–193, a variety of superconducting wires, cables and tapes have been developed for the transport of electrical current. A key parameter defining the performance and thus the economic benefit of these conductors is given by their so-called critical current density, which is the maximum density of the current these conductors can carry as so-called supercurrents in the superconducting state. The critical current density is a specific property for a given superconductor, and, for the practical use of a superconductor, one aims at maximizing this critical current density.

Chaudhari et al. have taught in their article "Direct Measurement of the Superconducting Properties of Single Grain Boundaries in $YBa_2Cu_3O_{7-\delta}$", Physical Review Letters, Vol. 60, 1988, pp.1653–1655, that the limiting factor for the critical current density of polycrystalline high-$T_c$ superconductors is the electronic behavior of the boundaries formed by the crystalline grains of these materials. It was shown that the critical current densities of these grain boundaries are smaller by one to two orders of magnitude than the critical current densities of the grains abutting the grain boundaries.

Further, Dimos et al. have taught in their publication "Superconducting Transport Properties of Grain Boundaries in $YBa_2Cu_3O_{7-\delta}$ Bicrystals", Physical Review B, Vol. 41, 1990, pp. 4038–4049, that superconducting grains with a small misorientation (below typically 8° to 10°) behave as strongly coupled superconductors whereas larger misorientations (also called large-angle grain boundaries) are weakly coupled, showing Josephson junction-like properties. The teaching by Dimos et al. is the finding that the detrimental effect of the grain boundaries can be reduced by aligning the superconducting grains with respect to their crystalline main axes.

Following this proposal, wires and tapes of high-$T_c$ superconductors have been fabricated, the critical currents of which are enhanced by aligning the superconducting grains by a variety of means, such as rolling processes or ion beam assisted techniques. Although these technologies have lead to the fabrication of high-$T_c$ superconductors with current densities of the order of 100 000 A/cm$^2$ at temperatures of 4.2 K, it remains desirable to fabricate high-$T_c$ superconductors with still higher critical current densities or with processes which are less costly than the known ones.

Figure 1:
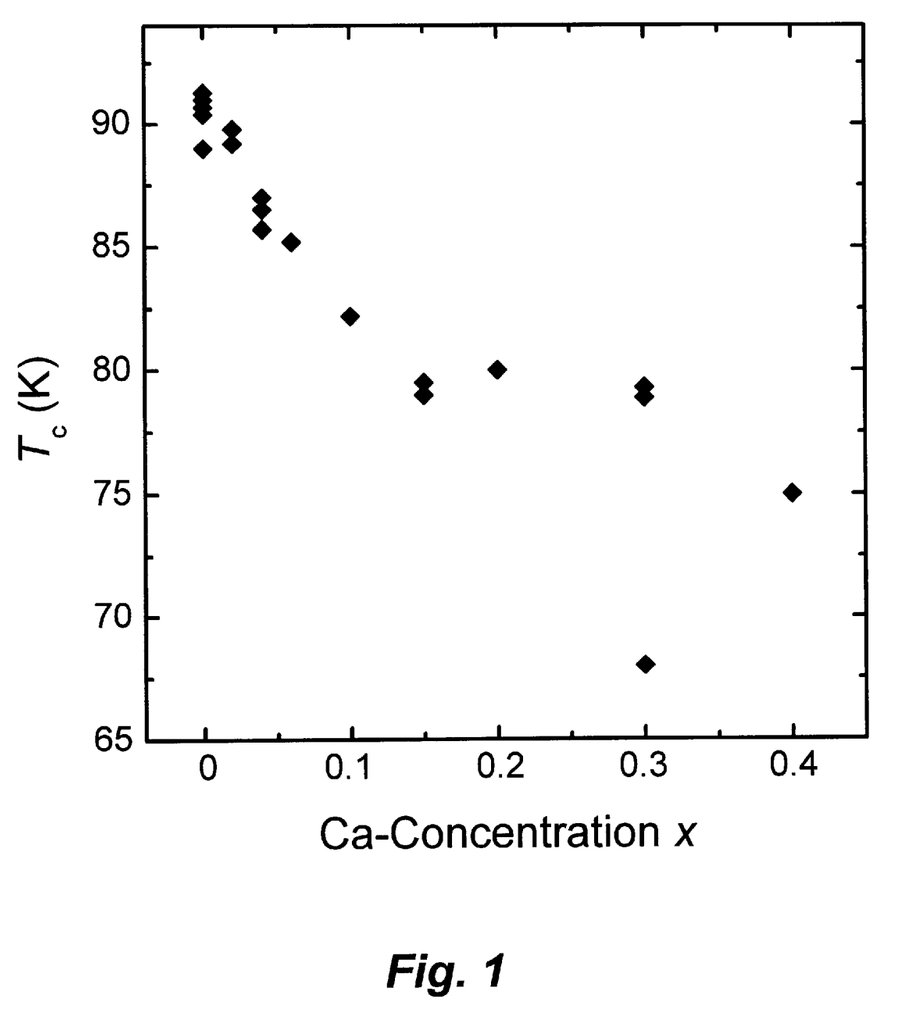
FIG. 1 shows the variation of the critical temperature $T_c$ of bicrystalline $Y_{1-x}Ca_xBa_2Cu_3O_{7-\delta}$ films as a function of the dopant concentration x. These samples contained 24° [001] tilt grain boundaries.
Figure 2:
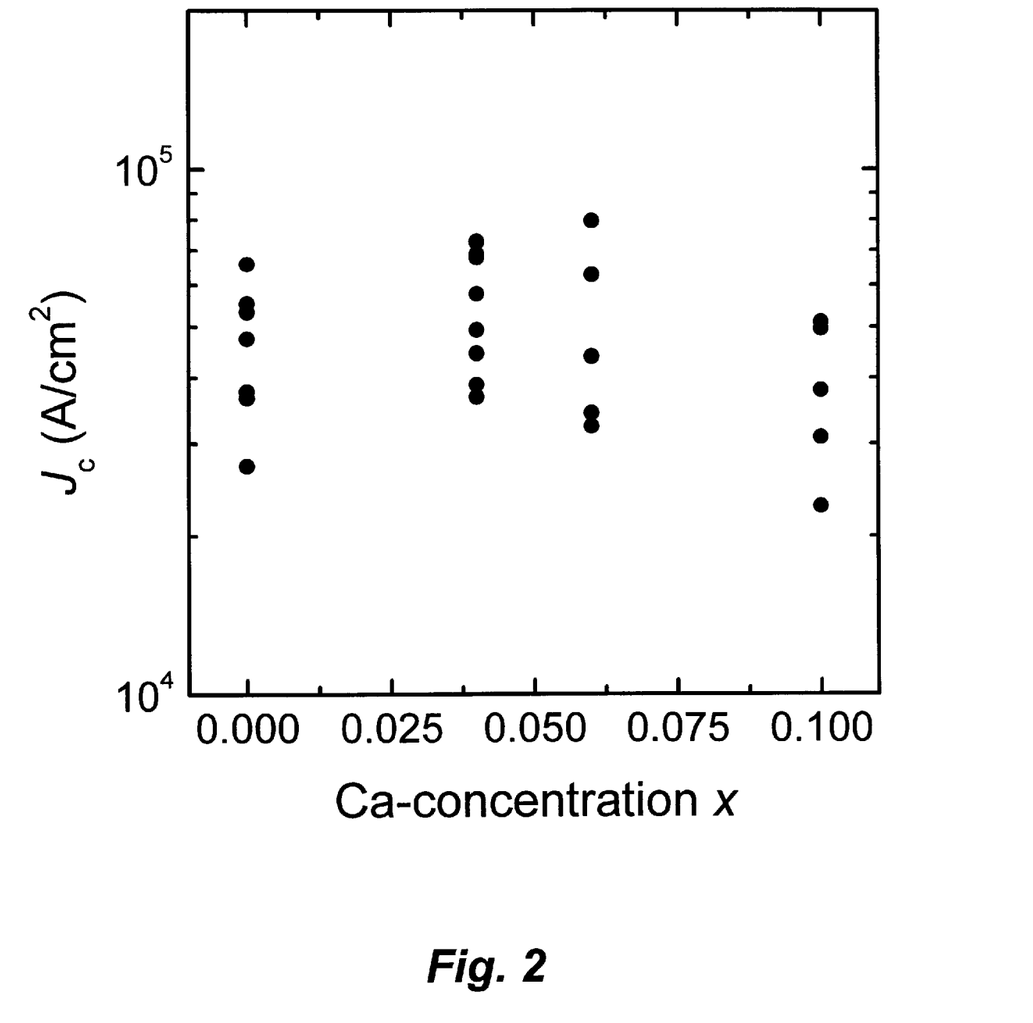
FIG. 2 shows the variation of the critical current density $J_c$ of bicrystalline $Y_{1-x}Ca_xBa_2Cu_3O_{7-\delta}$ films, again as a function of the dopant concentration x. The current density has been measured at 77 K. These samples also contained 24° [001] tilt grain boundaries.

Schmehl et al. in "Doping Induced Enhancement of the Critical Currents of Grain Boundaries in $YBa_2Cu_3O_{7-\delta}$", Europhysics Letters, Vol.47, 1999, pp. 110–115; Mannhart et al. in European Patent Application EP 1 006 594 A1, "Superconductor with Enhanced Current Density and Method for Making such a Superconductor", and G. A. Daniels et al. in "Improved Strong Magnetic Field Performance of Low Angle Grain Boundaries of Calcium and Oxygen Overdoped $YBa_2Cu_3O_x$" Appl. Phys. Lett., Vol.77, 2000, pp. 3251–3253, have shown that the critical current densities of the grain boundaries can be enhanced by doping of the superconductor to dopant concentrations different from concentrations that would provide the optimum superconducting properties of the grains of the superconductors. By this, large grain boundary critical current densities are achieved. Because the critical temperature of the grains is reduced by this doping (see FIG. 1), the enhancement of the grain boundary critical current density is not obtained at 77 K (see FIG. 2) but only in the temperature range below. The temperature of liquid nitrogen, 77 K, is a preferable temperature for the operation of superconducting cables. As shown in "Doping Induced Enhancement of the Critical Currents of Grain Boundaries in High-$T_c$ Superconductors" by Mannhart et al, Physica C, Vol. 341–348, 2000, pp. 1393–1396, doping of $YBa_2Cu_3O_{7-\delta}$ with Co achieves the opposite effect and enhances the sample's normal state resistance.

As described in the above-cited European Patent Application EP 1 006 594 A1, "Superconductor with Enhanced Current Density and Method for Making such a Superconductor", it was recognized that a preferential doping of the grain boundaries is advantageous in many cases.

The present invention now aims to achieve large critical current densities in a wide temperature regime, in particular in the range of 77 K and above, by avoiding the degradation of the grains due to their non-optimal doping. This different and novel approach according to the invention is—in brief—the teaching that by use of dopant multilayers, the critical current densities of the grain boundaries in a superconductor, and therefore also of the polycrystalline conductors, can be enhanced by doping the grain boundaries to dopant concentrations different from the dopant concentrations of the superconducting grains. Ivanov et al. report in "Properties of Locally Doped Bicrystal Grain Boundary Junctions", Physica B, Vol. 194–196, 1994, pp. 2187–2188, experiments in which they investigated the effects of Fe and Pt embedded into grain boundaries in $YBa_2Cu_3O_{7-\delta}$ films on the transport properties of these grain boundaries. In this work, the grain boundaries were also doped to concentrations different from the dopant concentrations of the grains. This was achieved by using specially prepared bicrystalline substrates. Prior to the growth of the high-$T_c$ superconductors, Fe and Pt dopants were embedded into the grain boundary of the substrate, which was a $ZrO_2$ bicrystal. During the growth of the superconducting film, the substrate acted as a source of the dopants. In these experiments, a strong reduction of the critical current density was observed, i.e. just the opposite of the aim of the present invention. The critical current reduction in the Ivanov et al. experiment presumably took place due to the unsuited doping configuration as well as due to an unsuited selection of the dopants.

SUMMARY OF THE INVENTION

A general objective of the present invention is to provide a solution for an increased use of high-$T_c$ and other superconducting materials by improving the current transport mechanisms within such materials, in particular for increasing the upper limit of the achievable supercurrent density within such materials.

A specific objective, as mentioned above, is to provide an approach by which the current carrying capabilities of superconductors, e.g. superconducting wires or tapes, can be significantly improved in a wide temperature range.

A further objective of the invention is to provide a technique for a simpler manufacturing process, resulting in cheaper mass production of polycrystalline superconductors with large critical current densities than with presently used techniques. At present, the fabrication of such superconductors requires cumbersome and costly processes to optimize the grain boundary geometries, such as improving their alignment or enhancing the effective grain boundary area.

A still further objective is to provide an approach for reducing the sensitivity of the critical current densities of polycrystalline superconductors to magnetic fields, which often exist in the environment in which the superconductor is operated or which are induced by the supercurrents themselves. Generally, the critical current densities of superconductors are easily reduced or suppressed by magnetic fields, which poses a severe problem for all applications in which the superconductors must be operated in magnetic fields, such as superconducting magnets or superconducting cables.

The novel solution taught by the invention is based on a better understanding of the transport mechanism within polycrystalline superconductors and consists essentially in chemically doping the grain boundaries of the superconductors to a dopant concentration different from the dopant concentrations of the grains.

This specific doping is achieved by using diffusion, in particular grain boundary diffusion, in e.g. multilayer structures as illustrated in detail below. This is done to modify space charge layers formed at the grain boundaries, e.g. by changing the density of the superconductor's charge carriers or by modifying the built-in potential of the grain boundaries in an uncommon way. By this, the current transport properties of the grain boundaries are optimized without deteriorating the grains themselves as taught by Hammerl et al., Nature Vol. 407, 2000, pp.162–164.

The hereby achieved concentrations of dopant ions at the grain boundaries differ substantially from the concentrations levels typically used to fabricate polycrystalline conductors. The reason is that in the known approaches no care is usually taken to dope the grain boundaries to optimal dopant concentrations differing from those of the grains. The novel approach according to the invention changes this picture and the understanding of the current transport mechanism in superconductors, particularly high-$T_c$ materials, especially with regard to the maximum (or critical) current density in such materials.

Another advantage of the approach according to the invention is that it simplifies the manufacturing process of superconductors for technical applications by allowing cheaper mass production of polycrystalline high-$T_c$ and other superconductors with large critical current densities. The reason is that the novel approach reduces the complexity of steps and processes which are used today for optimizing the geometries of the grain boundaries, as mentioned above.

As grain boundaries embedded in superconductors are also frequently used in electronic device applications, e.g. in superconducting quantum interference devices, the possibility to alter the grain boundaries specifically presents a novel opportunity to tune the grain boundaries used in such devices to optimal properties.

A still further advantage is the fact that the critical current densities of superconductors made according to the invention show a reduced sensitivity to magnetic fields which quite often exist in the vicinity of the superconductor, either from other sources or induced by the supercurrents themselves. Thus, superconductors according to the invention can be securely and efficiently operated in environments where strong magnetic fields are abundant, such as superconducting magnets or superconducting cables.

In the following, an implementation of the invention shall be described supported by the appended drawings.

BRIEF DESCRIPTION OF THE DRAWINGS

(FIG. 3 has been drawn after FIG. 5.26 published in G. Gottstein "Physikalische Grundlagen der Materialkunde", Springer-Verlag Berlin, Heidelberg, N.Y. (1998), p. 178, ISBN: 3-540-62670-0)

FIG. 6a displays the entire temperature regime measured, whereas FIG. 6b shows the "enlarged" temperature window around the superconducting transition. The samples contained 24° [001] tilt grain boundaries.

All samples contained 24° [001] tilt grain boundaries.

The following Table 1 lists some normal state resistance*cross-section area products and critical current densities, measured at 77 K and 4.2 K, namely of a bicrystalline $YBa_2Cu_3O_{7-\delta}$ film, a bicrystalline $Y_{0.7}Ca_{0.3}Ba_2Cu_3O_{7-\delta}$ film, a bicrystalline $YBa_2Cu_3O_{7-\delta}/Y_{0.7}Ca_{0.3}Ba_2Cu_3O_{7-\delta}$ bilayer, a bicrystalline $Y_{0.7}Ca_{0.3}Ba_2Cu_3O_{7-\delta}/YBa_2Cu_3O_{7-\delta}/Y_{0.7}Ca_{0.3}Ba_2Cu_3O_{7-\delta}$ trilayer, and a bicrystalline $YBa_2Cu_3O_{7-\delta}/Y_{0.9}Ca_{0.1}Ba_2Cu_3O_{7-\delta}$ superlattice.

TABLE 1

| Structure | 77 K | | 4.2 K | |
|---|---|---|---|---|
| | $R_nA$ (Ωcm²) | $J_c$ (A/cm²) | $R_nA$ (Ωcm²) | $J_c$ (A/cm²) |
| Undoped | $1 * 10^{-8}$ | $5 * 10^4$ | $1 * 10^{-8}$ | $5 * 10^5$ |
| x = 0.3 Ca-doped | — | — | $2 * 10^{-10}$ | $7 * 10^6$ |
| Doping bilayer | $1.3 * 10^{-9}$ | $1.2 * 10^5$ | $1.2 * 10^{-9}$ | $1.1 * 10^6$ |
| Doping trilayer | $1.5 * 10^{-9}$ | $3.3 * 10^5$ | $1.5 * 10^{-9}$ | $2.4 * 10^6$ |
| Doping superlattice | $2.5 * 10^{-9}$ | $2.0 * 10^5$ | $2.5 * 10^{-9}$ | $1.6 * 10^6$ |

All samples contained 24° [001]-tilt grain boundaries.

DESCRIPTION OF EXAMPLES AND EMBODIMENTS

Studies of single grain boundaries performed and published by the inventors in "Superconducting and Normal-state Properties of $YBa_2Cu_3O_{7-\delta}$ Bicrystal Grain Boundary Junctions in Thin Films", Appl. Phys. Lett. Vol. 73, 1998, pp. 265–267 and in "Doping Induced Enhancement of the Critical Currents of Grain Boundaries in $YBa_2Cu_3O_{7-\delta}$", Europhysics Letters, Vol.47, 1999, p. 110–115, have lead to a better understanding of the processes which limit the critical current densities of these grain boundaries. In particular, the electronic transport properties of the grain boundaries are negatively affected by space charge layers formed at these interfaces.

Figure 5A:
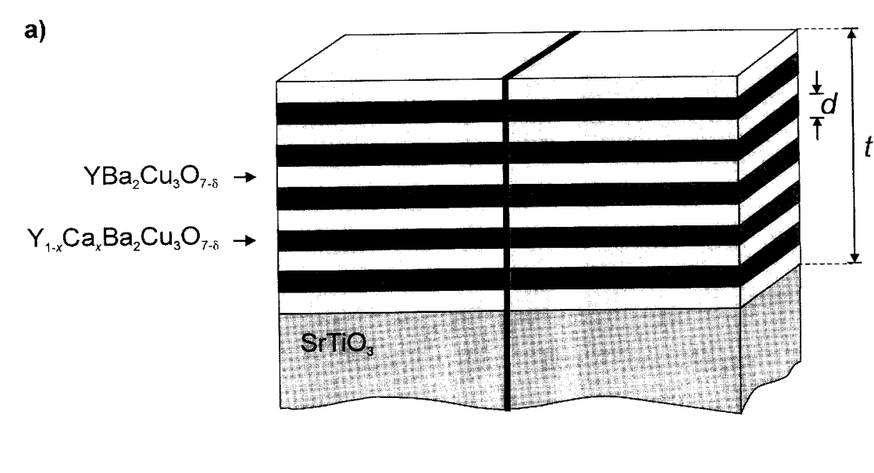
FIG. 5a shows an example of a multilayer structure involving doped and undoped high-$T_c$ films. In the example, $YBa_2Cu_3O_{7-\delta}$ is used for the undoped material and $Y_{1-x}Ca_xBa_2Cu_3O_{7-\delta}$ for the doped material(s). The layer thickness d chosen for the doped and undoped films was typically 20 nm to obtain a total thickness t depending on the number of sequences of doped and undoped layers. A typical total thickness t can reach 200–300 nm or more.
Figure 5B:
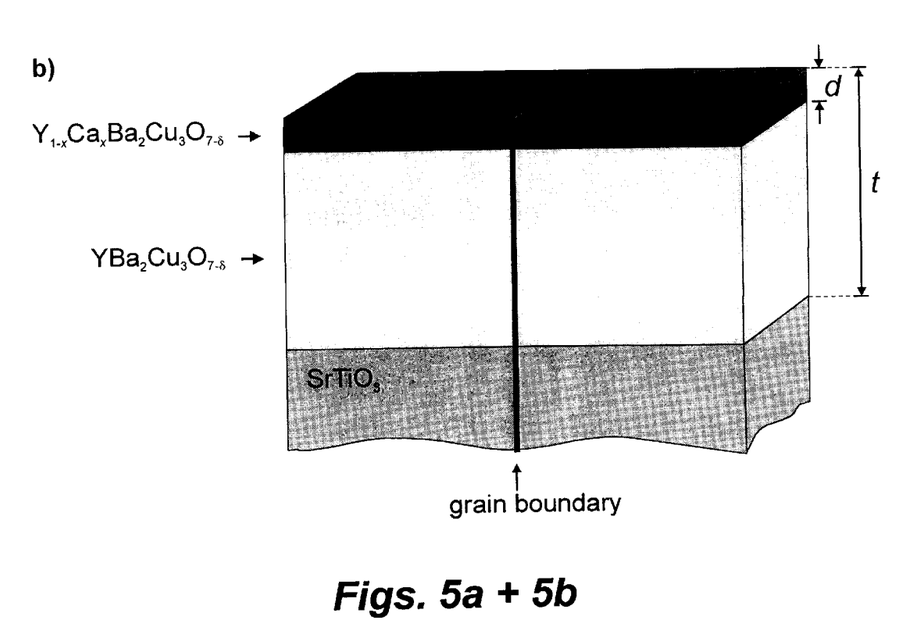
FIG. 5b shows an example of a bilayer structure, similar to FIG. 5a, involving doped and undoped high-$T_c$ films. Again, $YBa_2Cu_3O_{7-\delta}$ is used for the undoped material and $Y_{1-x}Ca_xBa_2Cu_3O_{7-\delta}$ for the doped material(s). The thickness d chosen for the doped layer can vary between 5–50 nm to obtain a typical total thickness t for the bilayer of 160 nm.

Based on this understanding, it was recognized that the critical current density of the grain boundaries may be enhanced by chemically doping the grain boundaries to dopant concentrations which differ from the dopant concentration of the grains. It was found that by using grain boundary diffusion in bilayer or multilayer structures consisting of doped and undoped films, e.g. of $YBa_2Cu_3O_{7-\delta}$ and $Y_{1-x}Ca_xBa_2Cu_3O_{7-\delta}$ bilayers, as illustrated in FIG. 5, the critical current densities of the grain boundaries can be enhanced and their normal state resistance decreased in a wide temperature regime, as shown in Table 1 above.

Figure 3:
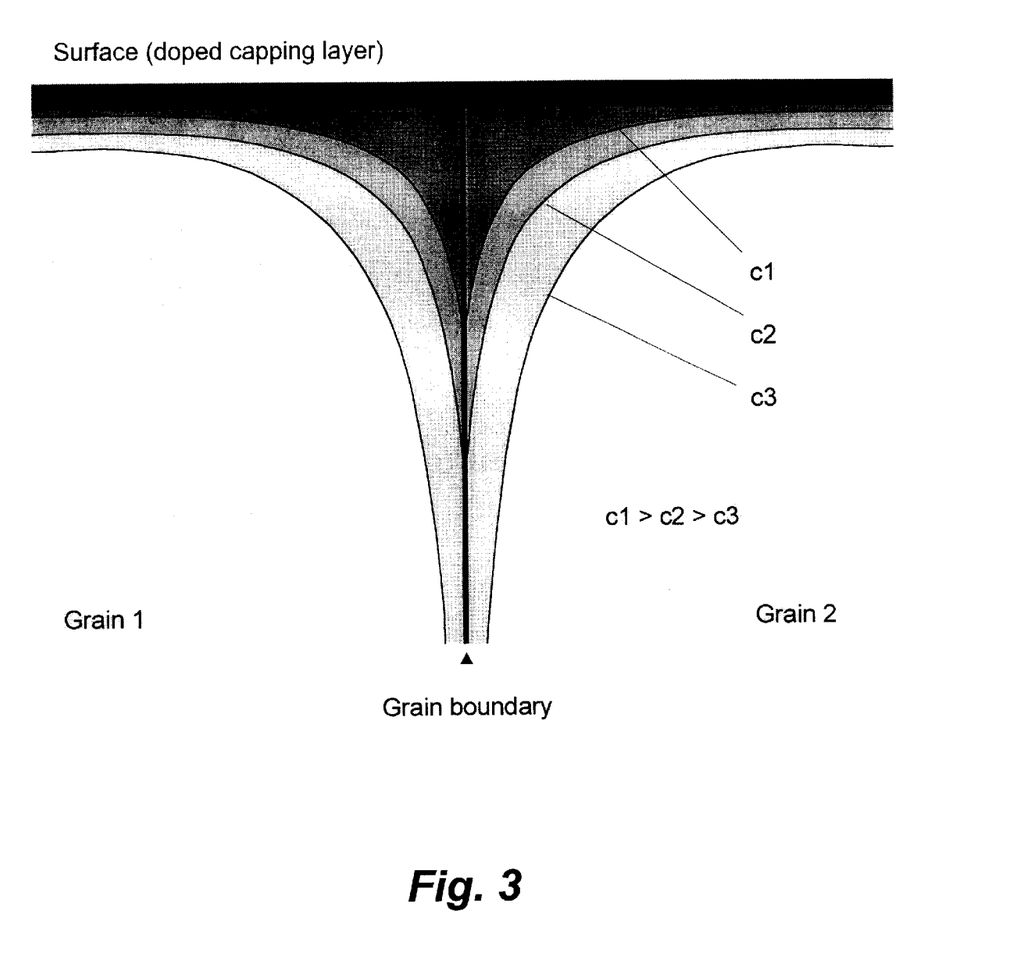
FIG. 3 is a graph depicting an example of a dopant profile along a grain boundary as achieved by using grain boundary diffusion. The doping concentration varies from the top to the bottom of the sample as illustrated by the isoconcentration lines representing three different concentrations c1, c2 and c3, respectively.

The dopant concentration c(x,y,t) resulting from grain boundary diffusion can be expressed by the following formula, according to G. Gottstein "Physikalische Grundlagen der Materialkunde", Springer-Verlag Berlin, Heidelberg, N.Y. (1998), Chapter 5:

$$c(x, y, t) = c_o \exp\left[-y\frac{\sqrt{2}}{\sqrt[4]{\pi D_V t}\sqrt{\delta D_{KG}/D_V}}\right]\left\{1 - erf\left(\frac{x}{2\sqrt{D_V t}}\right)\right\}$$

with $D_{KG}$ being the diffusion coefficient along the grain boundary, $D_V$ the bulk (intragrain) diffusion coefficient, δ being the width of the grain boundary, t the processing time, $c_o$ a constant, and erf(z) being the error function. The x axis of the coordinate system is perpendicular to the grain boundary, the y axis points along the grain boundary. This formula is an approximate description of the diffusion process along and out of the grain boundary. The exponential function describes the diffusion along the grain boundary, and the lateral penetration of the dopant is expressed by the error function.

Figure 6A:
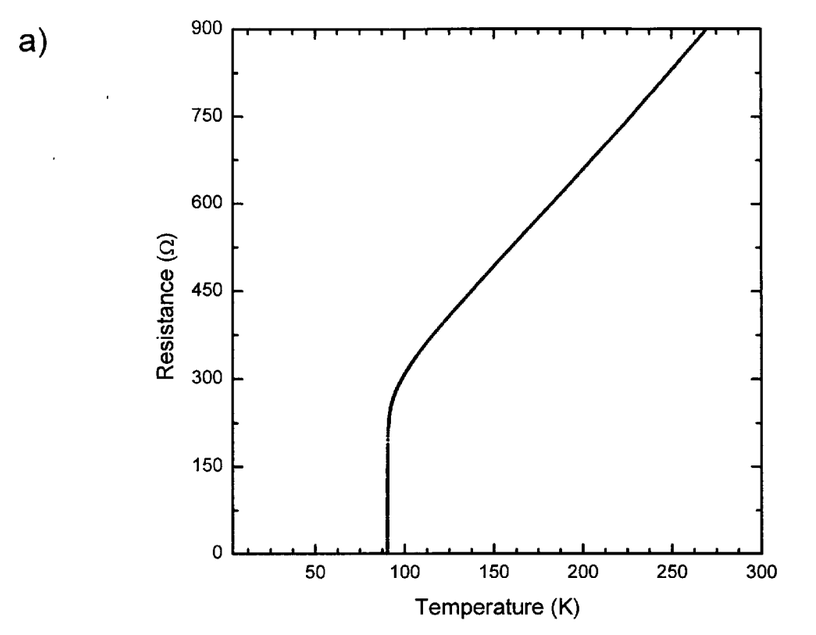
FIGS. 6a, 6b show the resistance of bicrystalline films of $YBa_2Cu_3O_{7-\delta}/Y_{1-x}Ca_xBa_2Cu_3O_{7-\delta}$ bilayers as a function of temperature.
Figure 6B:
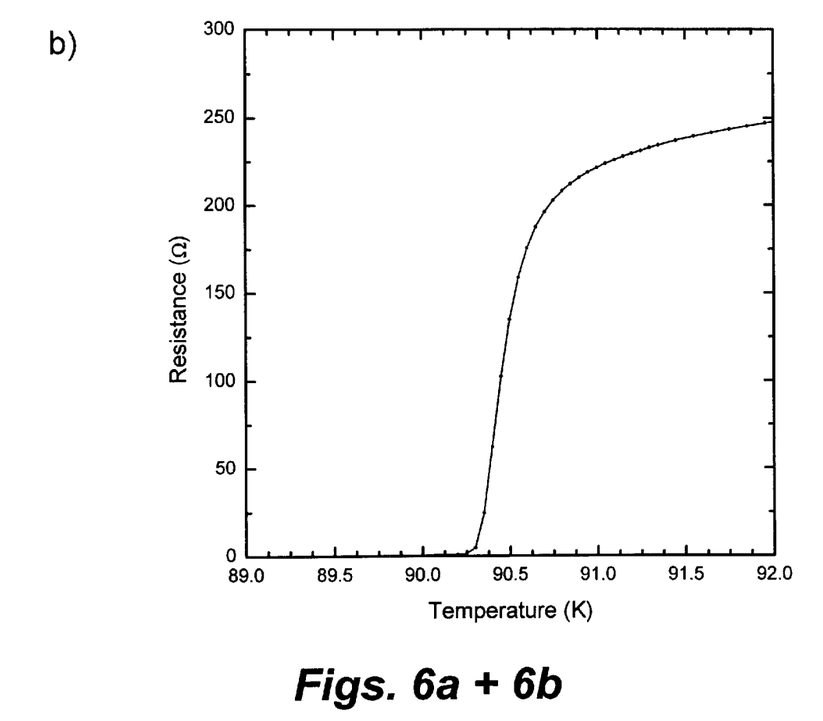
Figure 7:
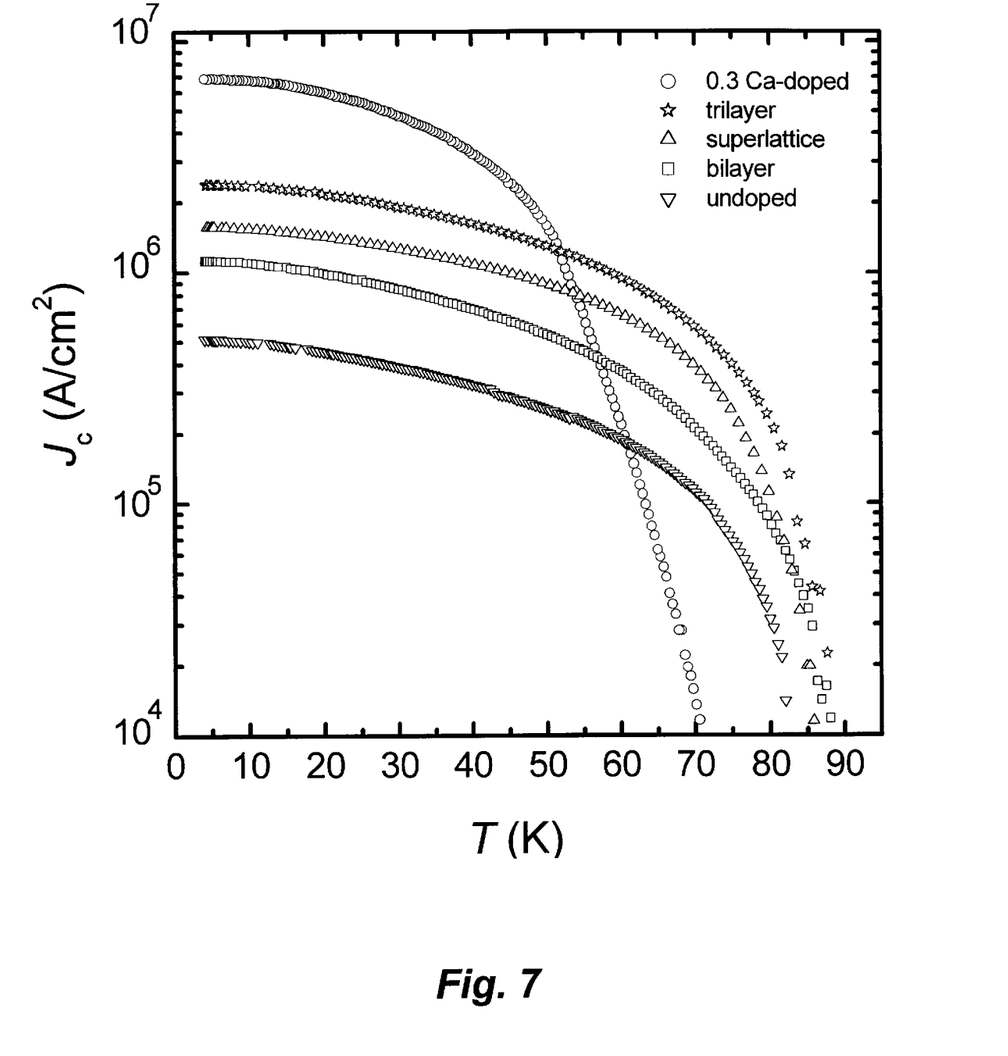
FIG. 7 shows, as a function of temperature T, the critical current densities $J_c$ of a bicrystalline $YBa_2Cu_3O_{7-\delta}$ film, a bicrystalline $Y_{0.7}Ca_{0.3}Ba_2Cu_3O_{7-\delta}$ film, a bicrystalline $YBa_2Cu_3O_{7-\delta}/Y_{0.7}Ca_{0.3}Ba_2Cu_3O_{7-\delta}$ bilayer, a bicrystalline $Y_{0.7}Ca_{0.3}Ba_2Cu_3O_{7-\delta}/YBa_2Cu_3O_{7-\delta}/Y_{0.7}Ca_{0.3}Ba_2Cu_3O_{7-\delta}$ trilayer, and a bicrystalline $YBa_2Cu_3O_{7-\delta}/Y_{0.9}Ca_{0.1}Ba_2Cu_3O_{7-\delta}$ superlattice.

Since this method of selective dopant diffusion along the grain boundary keeps the critical temperature of the grains at high values, shown in FIG. 6, it becomes rather easy to fabricate polycrystalline superconductors with a good grain boundary coupling and a large critical temperature. Thus, large grain boundary critical current densities can be obtained at all temperatures up to the critical temperature of optimally doped grains, as shown in FIG. 7.

It is known that the properties of superconductors, specifically high-$T_c$ superconductors, such as their critical temperatures or their critical current densities, may be improved by thermal annealing at elevated temperatures in well-defined atmospheres, such as oxygen or air, in order to adjust the oxygen content and the oxygen distribution in the superconductor. An example for such an annealing procedure is given in Schmehl et al. in "Doping Induced Enhancement of the Critical Currents of Grain Boundaries in $YBa_2Cu_3O_{7-\delta}$", Europhysics Letters, Vol.47, 1999, pp. 110–115.

By ingeniously applying this knowledge to the present invention, it was found that a preferred way to exploit the beneficial effects of the doping even better is to adjust the oxygen concentration of the superconductor by choosing an appropriate annealing procedure for each dopant concentration. For example, to take the best advantage of the improvement of the critical current density by using dopant multilayers consisting $YBa_2Cu_3O_{7-\delta}$ and $Y_{1-x}Ca_xBa_2Cu_3O_{7-\delta}$ films, these films may be annealed after fabrication by an additional annealing step in 1 bar of $O_2$ at a temperature of 420° C. for 20 minutes.

Guided by the new understanding and vision, a series of samples consisting of $YBa_2Cu_3O_{7-\delta}/Y_{1-x}Ca_xBa_2Cu_3O_{7-\delta}$ multilayers was fabricated. In these structures, a well defined grain boundary with a 24° [001]-tilt misorientation was embedded by means of the so called bicrystal technique using pulsed laser deposition, as described in Appl. Phys. Lett. Vol. 73, 1998, pp. 265–267. In these films of $Y_{1-x}Ca_xBa_2Cu_3O_{7-\delta}$, the Ca substitution is used as a means of doping to enhance the carrier concentration of the $YBa_2Cu_3O_{7-\delta}$ superconductor into the so-called overdoped regime. The films were grown in an oil-free UHV-type vacuum system using oxygen with a purity of 99.9999% and a pressure of 0.25 mbar, target materials with a purity of 99.999%, heater temperatures of 760° C. stabilized to within 2° C., laser pulses of an energy density of 2.2 J/cm² at 248 nm and a cool down procedure at 0.4 bar of oxygen including an annealing step of 12 minutes at 400° C. The temperature of the heater block to which the substrates were glued during growth is plotted in FIG. 4. The parameters were optimized to ensure that the measured critical current densities were not influenced by artifacts, but instead achieved the maximum values of the critical current densities attainable for the grain boundaries.

Figure 4:
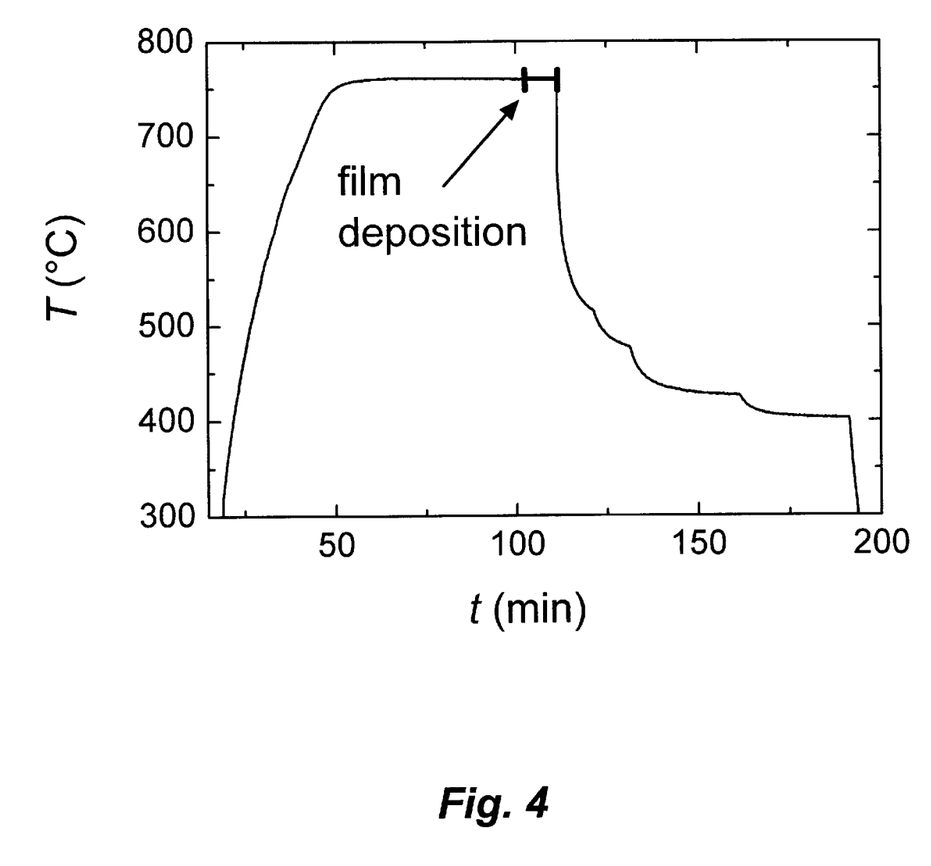
FIG. 4 shows the temperature T of the heater onto which the substrates were glued when growing bilayer or multilayer samples as described below.

To foster the diffusion of Ca along the boundaries, studies were performed in which the samples were kept for several hours at temperatures as high as 800° C. It was found that such an annealing step did not improve the superconducting properties considerably. Therefore it was concluded that for the sample structures used in the experiments the standard growth time and growth temperature employed, as shown in FIG. 4, was sufficient to ensure Ca diffusion. Obviously, for other samples, e.g. with larger layer thickness or with other dopants, dedicated growth parameters and annealing steps may be used to optimize the diffusion.

It is noted that, in the meantime, Berenov et al. have measured the diffusion coefficient for Ca-diffusion along the grain boundaries in $YBa_2Cu_3O_{7-\delta}$ in a paper submitted for publication in IEEE Trans. Appl. Supercond. to appear in 2001. As we had presumed, these studies demonstrated that the coefficient for diffusion along the grain boundary exceeds the intragrain diffusion coefficients by orders of magnitude.

After growth and annealing, the films were patterned by standard photolithographic means in a way that the critical current density of the grain boundaries could be measured by transport measurements. In FIG. 7, the critical current densities of these samples are shown for various layer sequences. As can clearly be seen, by the use of multilayers, such as bilayers, trilayers or superlattices, the critical current density of the samples was strongly enhanced in a wide temperature regime around 77 K. Only at temperatures below 54 K, the critical current densities of the multilayers are surpassed by the critical current density of $Y_{1-x}Ca_xBa_2Cu_3O_{7-\delta}$ monolayers.

The critical current densities achieved by the multilayers at 77 K were as large as $3.3 \times 10^5$ A/cm² as reported by Hammerl et al., Nature Vol. 407, 2000, pp. 162–164, and therefore exceeded the current densities of the best monolayer samples measured in the experiment, $5.5 \times 10^4$ A/cm² at the same temperature, by more than a factor of 6. It is noted that to our knowledge there is no publication reporting critical current densities of a 24° [001]-tilt grain boundary of $YBa_2Cu_3O_{7-\delta}$ exceeding $3.3 \times 10^5$ A/cm² at 77 K or being even close to this value.

Although the experiments were performed using 24° [001]-tilt grain boundaries, the results are representative for other grain boundary angles, as already demonstrated for low-angle grain-boundaries in homogeneously doped $YBa_2Cu_3O_{7-\delta}$ by G. A. Daniels et al. in "Improved Strong Magnetic Field Performance of Low Angle Grain Boundaries of Calcium and Oxygen Overdoped $YBa_2Cu_3O_x$," Appl. Phys. Lett., Vol.77, 2000, pp. 3251–3253. It is expected from persons skilled in the art, that the preferential doping of the grain boundaries will also lead to an improvement of critical currents for the technologically important low-angle grain boundaries at 77 K (P. M. Grant in "Currents without borders", Nature, Vol. 407, 2000, pp.139–141).

Thus, the technologically rather simple addition of Ca-doped layers to polycrystalline $YBa_2Cu_3O_{7-\delta}$ superconductors definitely enhances the critical current density in such superconductors substantially in a wide temperature range around 77 K.

Figure 8:
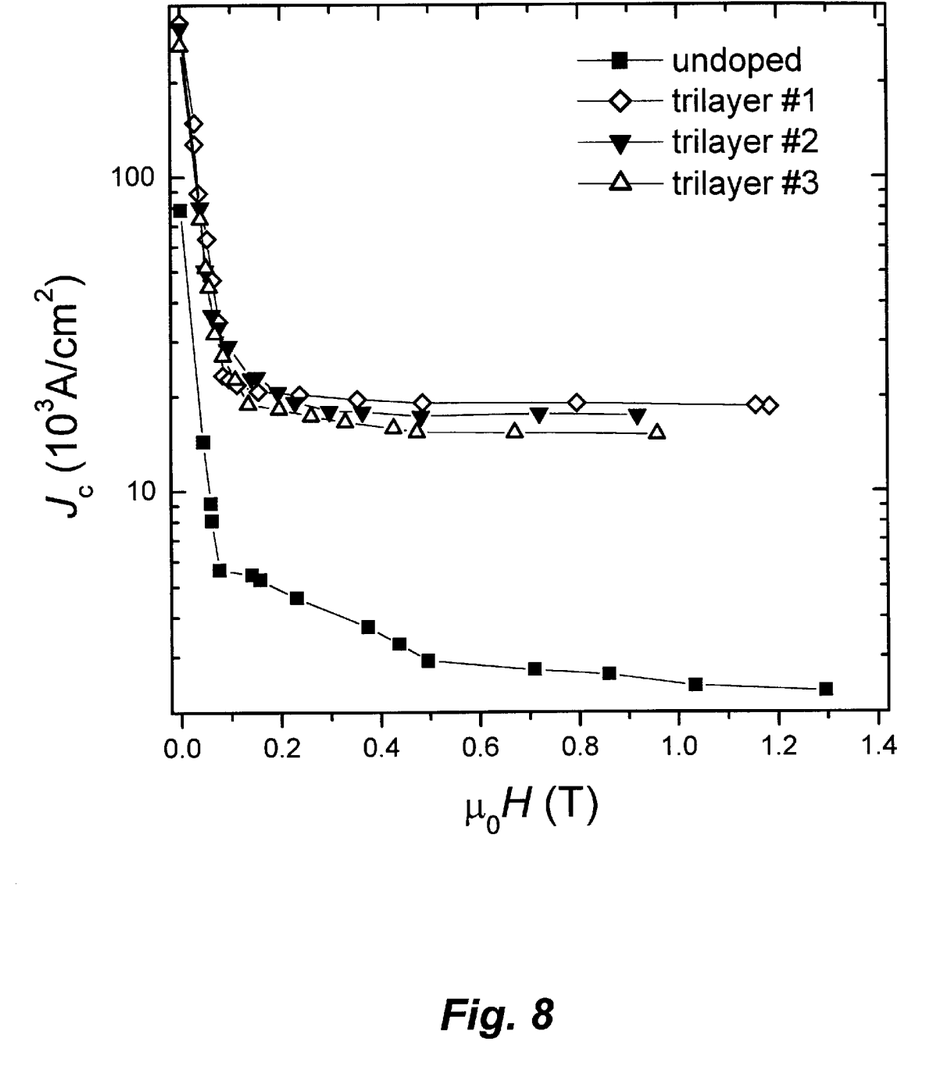
FIG. 8 is a graph showing the grain boundary critical current density $J_c$, measured at 77 K, as a function of an applied magnetic field for a $YBa_2Cu_3O_{7-\delta}$ film and for various $Y_{0.7}Ca_{0.3}Ba_2Cu_3O_{7-\delta}/YBa_2Cu_3O_{7-\delta}/Y_{0.7}Ca_{0.3}Ba_2Cu_3O_{7-\delta}$ trilayers. The magnetic field was applied in the grain boundary plane perpendicular to the samples' surfaces.
Figure 9:
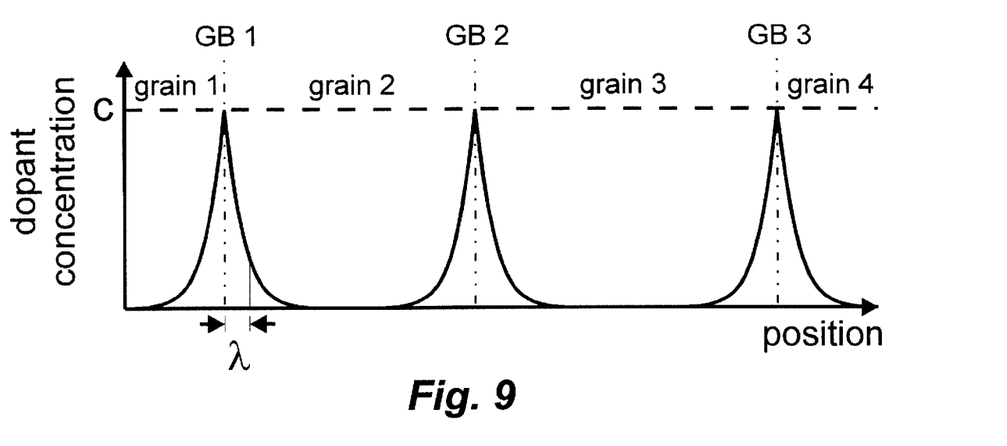
FIG. 9 shows a schematic drawing of a dopant profile for a polycrystalline superconductor as an example. Within a typical length scale λ around the grain boundary in the range of 0.1–10 nm, the dopant concentration c differs significantly from the dopant concentration within the abutting grains.

In addition, evidence was found that adding Ca to polycrystalline $YBa_2Cu_3O_{7-\delta}$ superconductors decreases the sensitivity of the critical current densities of the grain boundaries to magnetic fields, probably by strengthening the electronic coupling across the grain boundaries. Corresponding data are shown in FIG. 8. Therefore, such superconductor can carry significant supercurrents even in high magnetic fields, which offers large advantages for the application of such materials for the fabrication of wires or magnets.

Also, measurements have revealed a further advantage. It was found that the Ca doping of polycrystalline $YBa_2Cu_3O_{7-\delta}$ superconductors decreases the normal state resistivity of the superconductor as shown in Table 1. The "normal state resistivity" is the resistivity shown by the superconductor if it is biased with electric currents which exceed its critical current. As revealed by the measurements, doping can thus be used to tune the normal state resistance of high-$T_c$ superconductors. This offers considerable advantages for the use of such materials in applications in which the normal state resistance plays a role, e.g. affects the performance of the application. Examples for such applications are wires and tapes, or fault current limiters, which, if switched into the normal state, have to suppress an electrical current as efficiently as possible.

The improved coupling between the grains with their reduced interface resistance will also affect the microwave surface resistance of superconductors e.g. thin films as used for high-frequency applications as reported by Y. M. Habib et al. "Microwave power handling in engineered $YBa_2Cu_3O_{7-\delta}$ a grain boundaries", Appl. Phys. Lett., Vol. 73, 1998, pp. 2200–2202, by reducing the contribution to the residual loss originating from the grain boundaries and therefore improve the performance of the superconducting elements significantly.

There is no doubt that other materials than Ca can be used to achieve the same basic effect as dopant, and that also for other applications, which may require very small critical current densities or large normal state resistances, dopants such as Co may be used, which achieve these effects. Further, it is obvious to those skilled in the art, that also critical current densities of grain boundaries in other superconducting compounds than $YBa_2Cu_3O_{7-\delta}$ can be increased as well. These compounds are well known and a list of them has been published for example by Park and Snyder in "Structures of High-Temperature Cuprate Superconductor", J. Am. Ceram. Soc., Vol. 78, 1995, pp. 3171–3194. Examples for such cases are provided in the following.

In addition, there is no doubt that other non-superconducting materials, structurally and chemically compatible to the cuprate superconductors, can be used to provide the dopant necessary to improve the electronic transport properties of said grain boundaries. One example for a doped non-superconducting material which can be used is the Perovskite-related compound $Pr_{1-x}Ca_xBa_2Cu_3O_{7-\delta}$.

For $YBa_2Cu_3O_{7-\delta}$ and similarly for all $REBa_2Cu_3O_{7-\delta}$ superconductors, where RE stands for an element belonging to the rare earths, which superconductors are preferred compounds for superconducting tapes, besides doping by Ca, doping by Sr, Bi, Ce or a combination of those may be used to enhance the critical current density of the grain boundaries.

Other high-$T_c$ compounds presently exploited for the fabrication of superconducting wires are the members of the so-called Bi-compounds, characterized by a stoichiometry of $Bi_mSr_2Ca_{n-1}Cu_nO_{2n+m+2+\delta}$ with m=1, 2, and n=1, 2, 3 or 4. In these materials, doping e.g. by Y, La, Sc, Ca, and/or Ba may be used to increase the critical current density of the grain boundaries.

Still other high-$T_c$ compounds of interest for the fabrication of superconducting wires are the members of the so-called Tl-compounds, characterized by a stoichiometry of $Tl_mBa_2Ca_{n-1}Cu_nO_{2n+m+\delta}$ with m=1, 2, and n=1, 2, 3, . . . . In these materials, doping e.g. by Ca, Y, La, Sc, and/or Sr can be used to increase the critical current density of the grain boundaries.

A further group of high-$T_c$ compounds also of interest for the fabrication of superconducting wires are the members of the so-called Hg-compounds, characterized by a stoichiometry of $Hg_mBa_2Ca_{n-1}Cu_nO_{2n+m+\delta}$ with m=1, 2, and n=1, 2, 3, . . . . In these materials, doping e.g. by Y, La, Sc, and/or Sr can be used to increase the critical current density of the grain boundaries.

A still further group of high-$T_c$ compounds also of interest for the fabrication of superconducting wires are the members of the so-called Cu-compounds, characterized by a stoichiometry of $Cu_mBa_2Ca_{n-1}Cu_nO_{2n+m+2+\delta}$ with m=1, 2, and n=1, 2, 3, . . . . In these materials, doping e.g. by Y, La, Sc, and/or Sr may be used to increase the critical current density of the grain boundaries.

Based on the above, a person skilled in the art will recognize that the described multilayer technique is one of numerous alternatives to provide the relevant dopant to the grain boundaries. Dopant material can be provided by e.g. diffusion out of a liquid, solid, or gas being in close contact with the superconductor. One example for doping out of a liquid phase is a Sol-Gel process as described by C. J. Brinker and G. W. Scherer, Sol-Gel Science, "The Physics and Chemistry of Sol-Gel Processing", New York, Academic Press, 1990, and by Berenov et al., submitted for publication in IEEE Trans. Appl. Supercond., to appear in 2001.

Another known approach yielding a dopant profile is grain boundary segregation, e.g. starting with homogeneously doped grains, the dopant(s) diffuse to the grain boundary or away from it during fabrication. Such a process is discussed in textbooks, e.g. by A. P. Sutton and R. W. Balluffi in "Interfaces in Crystalline Materials", Oxford Science Publications, Clarendon Press, Oxford, 1996, specifically in Chapters 7 and 8.

Figure 10:
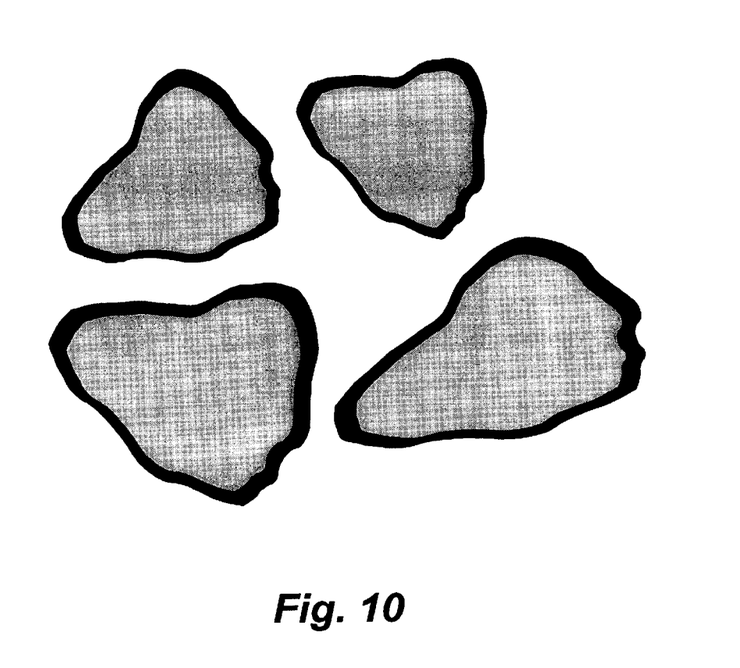
FIG. 10 shows a schematic drawing of grains of superconducting material (gray) such as a $YBa_2Cu_3O_{7-\delta}$ coated with a superconducting layer with a dopant concentration different from the grain (black) prior further processing such as sintering of the as described grains.

Another method to obtain optimized grain boundaries consists in coating superconducting grains with a layer of the desired doping material prior to a sintering process which produces the polycrystalline superconductor illustrated in FIG. 10. Methods of coating such grains are the known technique of spray coating or the already mentioned sol-gel technique.

Persons skilled in the art can apply this invention for cheaper mass production of superconducting tapes or wires, operated preferentially at 77 K or at any other temperature suitable for power applications or the design of strong magnets.

The main advantages offered by the invention, namely the enhanced current-carrying capabilities and the reduced sensitivity to magnetic fields, reduces the costly and cumbersome requirements to align the superconducting grains for wires as it is presently done for coated conductors. These properties make a superconductor according to the present invention perfectly suitable for many applications, e.g. as superconducting cables, wires or tapes, which have not been competitive and thus hardly marketable until now. With the invention, superconductors will become less expensive and thus broadly marketable and competitive for many applications.

Another advantage of a superconductor according to the present invention is its reduced interface resistance, which is beneficial for applications where the normal state resistance plays a role. Examples are switching elements such as fault current limiters where the smaller interface resistance reduces the thermal load in the normal state and thereby enhances the device operating regime and also its life-time.

The reduced losses due to a reduced interface resistance will also enhance the operating capabilities of microwave devices such as superconducting filters as already used for telecommunication. Here, the gain will be an even further reduction of the input loss compared with the already existing superconducting filter units. The advantage for the operator will be a larger range of transmission, better transmission quality and the posibility to serve more clients with a better quality in the same frequency band.

Based on the above description and the given examples and applications, a person skilled in the art can easily vary the described invention, its values, and its materials given above, and adapt the invention to other implementations without departing from the inventive gist as defined in the appended claims.

What is claimed is:

1. A method for making a superconductor with an increased critical current density, characterized by doping at least a part of said superconductor to achieve a predetermined dopant profile, thereby modifying electronic interface properties, said predetermined dopant profile being produced by a bilayer or multilayer structure, whose layers differ with regard to dopants and/or dopant concentrations.

2. The method according to claim 1, wherein the superconductor is a cuprate superconductor of the family of the Perovskites.

3. The method according to claim 1, comprising the step of diffusing one or more dopants along, towards, or out of the grain boundary to achieve said predetermined dopant profile.

4. The method according to claim 1, comprising the step of producing said predetermined dopant profile by a bilayer or multilayer structure, whose layers are made from the same material, but differ with regard to dopants and/or dopant concentrations.

5. The method according to claim 1, comprising the step of providing said predetermined dopant profile by layer(s) of doped non-superconductor material (s).

6. The method according to claim 1, comprising the step of adding at least one Ca-doped layer to said superconductor and the superconductor is a polycrystalline $YBa_2Cu_3O_{7-\delta}$ superconductor.

7. The method according to claim 1, wherein the superconductor is a $YBa_2Cu_3O_{7-\delta}/Y_{1-x}Ca_xBa_2Cu_3O_{7-\delta}$ multilayer structure containing at least one grain boundary with a misorientation angle larger than 8° and the Ca substitution in the layer of $Y_{1-x}Ca_xBa_2Cu_3O_{7-\delta}$ is the means of doping.

8. The method according to claim 1, comprising the step of using a variable dopant profile within a uniform superconductor structure.

9. The method according to claim 1, comprising the step of diffusing from one or more separate bodies, e.g. a rod, filament, sheet, or grains, embedded in the superconductor said body consisting of or including at least one dopant material other than said superconductor.

10. The method according to claim 1, comprising the step of diffusing from a separate body or material, e.g. from a surface or a cover, or from a gas or a plasma, or a liquid, or a combination of the latter, surrounding the superconductor, said body or material consisting of or including at least one dopant material other than said superconductor.

11. The method according to claim 1, comprising the step of fabricating at least one superconducting wire or tape wherein the doping is effected by grain boundary segregation and the dopant or dopants diffuse(s) to the grain boundary or away from it during fabrication.

12. The method according to claim 1, comprising the step of achieving a polycrystalline superconductor with a grain boundary dopant concentration differing from the dopant concentration of the grain by sintering superconducting grains which were coated with a doped layer prior to the sintering process.

13. The method according to claim 1, comprising the step of using one or more optimized annealing steps in oxygen, or air, or another suitable atmosphere, or vacuum to modify the carrier concentration at the grain boundaries and the grains.

14. The method according to claim 1, comprising the step of achieving the predetermined dopant profile and/or the desired changes of the grain boundaries by incorporating at least one element of the series H, Li, B, Si, La, Mg, Ca, Sr, Nd, Ce, Nb, Gd, Ba, Tl, Pb, Bi, Y, F, Cl, Mo into the superconductor's stoichiometry.

15. The method according to claim 1, further including an annealing step following the doping step.

16. The method according to claim 1 wherein said superconductor is selected from the group consisting of bicrystalline or polycrystalline superconductors of the family of ceramic superconductors.

17. The method according to claim 11 wherein said doping is started with homogeneously doped grains.

18. The method according to claim 9 wherein said superconductor is a polycrystalline superconductor.

19. The method according to claim 14 wherein said at least one element is selected from the group consisting of Ca and Sr for use in $YBa_2Cu_3O_{7-\delta}$.

20. The method according to claim 14 wherein said at least one element is selected from the group consisting of Y and Ba for use in $Bi_2Sr_2Ca_1Cu_2O_{8+\delta}$.

21. The method according to claim 14 wherein said at least one element is selected from the group consisting of Y and Ba for use in $Bi_2Sr_2Ca_2Cu_3O_{10+\delta}$.

22. The method according to claim 1, wherein the predetermined dopant profile is achieved by doping the superconductor's grain boundaries.

* * * * *